(12) United States Patent
Sulaiman et al.

(10) Patent No.: US 8,530,883 B2
(45) Date of Patent: Sep. 10, 2013

(54) MANUFACTURE OF QUANTUM DOT-ENABLED SOLID-STATE LIGHT EMITTERS

(75) Inventors: Yohann Sulaiman, Vancouver (CA); Richard MacKellar, Garibaldi Highlands (CA); Allan Brent York, Langley (CA)

(73) Assignee: Light-Based Technologies Incorporated, Vancouver (CA)

( * ) Notice: Subject to any disclaimer, the term of this patent is extended or adjusted under 35 U.S.C. 154(b) by 69 days.

(21) Appl. No.: 13/045,375

(22) Filed: Mar. 10, 2011

(65) Prior Publication Data

US 2011/0220870 A1 Sep. 15, 2011

Related U.S. Application Data

(60) Provisional application No. 61/339,908, filed on Mar. 11, 2010, provisional application No. 61/346,868, filed on May 20, 2010.

(51) Int. Cl.
*H01L 33/06* (2010.01)

(52) U.S. Cl.
USPC ............ 257/13; 257/17; 257/21; 257/E21.53; 257/E33.008; 438/7; 438/27; 438/28; 977/814

(58) Field of Classification Search
USPC ............ 257/13, 17, 21, 22, E21.53, E33.008; 438/7, 27, 28; 977/814
See application file for complete search history.

(56) References Cited

U.S. PATENT DOCUMENTS

| | | | |
|---|---|---|---|
| 5,902,489 | A | 5/1999 | Yasuda et al. |
| 5,909,614 | A | 6/1999 | Krivoshlykov |
| 6,216,538 | B1 | 4/2001 | Yasuda et al. |
| 6,424,004 | B2 | 7/2002 | Kim et al. |
| 6,501,091 | B1 | 12/2002 | Bawendi et al. |
| 6,544,808 | B2 | 4/2003 | Hoon |

(Continued)

FOREIGN PATENT DOCUMENTS

| | | |
|---|---|---|
| CN | 101157851 B | 4/2008 |
| GB | 2332564 A | 6/1999 |

(Continued)

OTHER PUBLICATIONS

Jeremy J. Hawkes, et al. Force field particle filter, combining ultrasound standing waves and laminar flow (2001) Sensors and Actuators, B: Chemical, 75 (3), pp. 213-222.

(Continued)

*Primary Examiner* — Thinh T Nguyen
(74) *Attorney, Agent, or Firm* — MBM Intellectual Property Law, LLP (57) ABSTRACT

Light emitting devices comprise excitation sources arranged to excite quantum dots which fluoresce to emit light. In an embodiment, a device is manufactured by a process which involves applying an acoustic field is applied to a fluid containing quantum dots, to cause the quantum dots to accumulate at locations which are adjacent to excitation sources, and then initiating a phase transition of the fluid to trap the quantum dots in the locations adjacent to the excitation sources. The quantum dots are illuminated during the process and the resulting fluorescence is optically monitored to provide indicators of quantum dot distribution in the fluid. These indicators are used as feedback for controlling aspects of the process, such as initiating the phase transition.

13 Claims, 6 Drawing Sheets

(56) References Cited

U.S. PATENT DOCUMENTS

| | | | |
|---|---|---|---|
| 6,544,870 B2 | 4/2003 | Park et al. |
| 6,753,545 B2 | 6/2004 | Kim |
| 6,846,565 B2 | 1/2005 | Korgel et al. |
| 6,859,477 B2 | 2/2005 | Deppe et al. |
| 6,870,311 B2 | 3/2005 | Mueller et al. |
| 7,180,065 B2 * | 2/2007 | Craig et al. | 250/338.4 |
| 7,301,172 B2 | 11/2007 | Atwater et al. |
| 7,306,963 B2 | 12/2007 | Linden |
| 7,341,878 B2 | 3/2008 | Krames et al. |
| 7,358,525 B2 * | 4/2008 | Lee | 257/22 |
| 7,358,543 B2 | 4/2008 | Chua et al. |
| 7,453,096 B2 | 11/2008 | Takahashi et al. |
| 7,481,562 B2 | 1/2009 | Chua et al. |
| 7,569,984 B2 | 8/2009 | Yang et al. |
| 7,579,770 B2 | 8/2009 | Yang et al. |
| 7,605,062 B2 | 10/2009 | Kahen |
| 7,609,929 B2 | 10/2009 | Seol et al. |
| 7,615,800 B2 | 11/2009 | Kahen |
| 7,645,402 B2 | 1/2010 | Choi et al. |
| 7,837,040 B2 | 11/2010 | Ward et al. |
| 2001/0039066 A1 | 11/2001 | Hoon |
| 2004/0131097 A1 | 7/2004 | Deppe et al. |
| 2004/0266148 A1 | 12/2004 | Yim et al. |
| 2005/0247924 A1 | 11/2005 | Atwater et al. |
| 2005/0279989 A1 | 12/2005 | Li et al. |
| 2006/0071218 A1 | 4/2006 | Takeda et al. |
| 2006/0086941 A1 | 4/2006 | Han et al. |
| 2006/0103589 A1 | 5/2006 | Chua et al. |
| 2006/0113895 A1 | 6/2006 | Baroky et al. |
| 2008/0173886 A1 | 7/2008 | Cheon et al. |
| 2008/0217602 A1 | 9/2008 | Kahen |
| 2009/0001403 A1 | 1/2009 | Skipor et al. |
| 2009/0109435 A1 | 4/2009 | Kahen et al. |
| 2009/0167146 A1 | 7/2009 | Yang et al. |
| 2009/0305442 A1 | 12/2009 | Ebe et al. |
| 2010/0176715 A1 | 7/2010 | Bawendi et al. |

FOREIGN PATENT DOCUMENTS

| | | |
|---|---|---|
| KR | 2005003548 A | 1/2005 |
| KR | 2006037033 A | 5/2006 |
| KR | 2007078494 A | 8/2007 |

OTHER PUBLICATIONS

Adrian Neild, et al., A micro-particle positioning technique combining an ultrasonic manipulator and a microgripper. J. Micromech. Microeng. 16 (2006) 1562-1570.

T. Masudo, et al. Particle Separation with Ultrasound Radiation Force. Current Analytical Chemistry, vol. 2, No. 2, Apr. 2006, pp. 213-227(15).

Mohammad H. Entezari, et. al, Micro-emulsion under ultrasound facilitates the fast synthesis of quantum dots of CdS at low temperature (2011) Ultrasonics Sonochemistry, 18 (1), pp. 127-134.

* cited by examiner

MANUFACTURE OF QUANTUM DOT-ENABLED SOLID-STATE LIGHT EMITTERS

FIELD OF THE TECHNOLOGY

The present technology pertains in general to solid state light emitting devices, and in particular to techniques for fabricating solid-state light emitters which include quantum dot technology, and to solid-state light emitters fabricated by such techniques.

BACKGROUND

Quantum dot-enabled light emitting devices comprise excitation sources arranged to excite quantum dots which fluoresce to emit light. The quantum dots may fluoresce at a range of wavelengths to emit light having a broad spectrum.

The use of quantum dots in the photon down-conversion of light from LEDs is known in the prior art. For example, U.S. Pat. No. 6,501,091 discloses an electronic device comprising a population of quantum dots embedded in a host matrix and a primary light source which causes the dots to emit secondary light of a selected color, and a method of making such a device. The size distribution of the quantum dots is chosen to allow light of a particular color to be emitted therefrom. The light emitted from the device may be of either a pure (monochromatic) color, or a mixed (polychromatic) color, and may consist solely of light emitted from the dots themselves, or of a mixture of light emitted from the dots and light emitted from the primary source. The dots desirably are composed of an undoped semiconductor such as CdSe, and may optionally be overcoated to increase photoluminescence. In some embodiments, there is provided a prepolymer colloid. In this aspect, a liquid or semisolid precursor material is provided with a population of quantum dots disposed therein. The colloid is capable of being reacted, for example by polymerization, to form a solid, transparent, nonconductive host matrix. The quantum dots may have been coated with a material having an affinity for the precursor material. The precursor material may be a monomer, which can be reacted to form a polymer.

However, the process of fabricating a quantum dot-enabled light source has not fully matured, and there is currently an opportunity to identify and provide improvements to such processes, which would provide for more economic and effective production of these light sources.

Therefore there is a need for techniques for fabricating solid-state light emitters which include quantum dot technology, and to solid-state light emitters fabricated by such techniques, that are not subject to one or more limitations of the prior art.

This background information is provided for the purpose of making known information believed by the applicant to be of possible relevance to the present technology. No admission is necessarily intended, nor should be construed, that any of the preceding information constitutes prior art against the present technology.

SUMMARY

An object of the present technology is to provide techniques for fabricating solid-state light emitters which include quantum dot technology, and to solid-state light emitters fabricated by such techniques. In accordance with an aspect of the present technology, there is provided a method for manufacturing a light emitting device, the method comprising: providing a substrate having one or more excitation sites; providing a fluid adjacent to the substrate and in contact with the substrate, the fluid carrying quantum dots; applying a stationary acoustic field within the fluid and allowing the acoustic field to cause the quantum dots to accumulate at locations proximate to the excitation sites; monitoring a distribution of the quantum dots within the fluid; and initiating a phase transition of the fluid based at least in part on the monitored distribution of the quantum dots, thereby trapping the quantum dots at the locations proximate to the excitation sites.

In accordance with another aspect of the present technology, there is provided a light emitting device comprising: a substrate having one or more excitation sites; one or more excitation sources operatively coupled to the one or more excitation sites, the one or more excitation sources at least in part configured for excitation of quantum dots; and a conversion layer adjacent to the substrate, the conversion layer containing quantum dots suspended in a light-transmissive material; wherein the conversion layer is provided by: providing a fluid in a container, the fluid carrying quantum dots; applying an acoustic field within the fluid; allowing the acoustic field to cause the quantum dots to accumulate at one or more predetermined locations corresponding to the excitation sites; monitoring a distribution of the quantum dots within the fluid; and initiating a phase transition of the fluid based at least in part on the monitored distribution of the quantum dots, thereby trapping the quantum dots at the predetermined locations.

BRIEF DESCRIPTION OF THE FIGURES

These and other features of the technology will become more apparent in the following detailed description in which reference is made to the appended drawings.

DETAILED DESCRIPTION

Definitions

As used herein, the term "about" refers to a +/−10% variation from the nominal value. It is to be understood that such a variation is always included in a given value provided herein, whether or not it is specifically referred to.

Unless defined otherwise, all technical and scientific terms used herein have the same meaning as commonly understood by one of ordinary skill in the art to which this technology belongs.

An aspect of the present technology provides a method for manufacturing a light emitting device. The method comprises providing a substrate having one or more excitation sites. The excitation sites may correspond to the location or planned location of excitation sources. The method further comprises providing a fluid adjacent to the substrate and in contact with the substrate. The fluid may intially carry quantum dots and/or may have quantum dots introduced therein during performance of the method. For example, quantum dots may be added prior to and/or during acoustic manipulation of the fluid by injection at one or more sites or by addition, via fluid flow, of fresh fluid containing quantum dots. The fluid is typically transmissive to light of at least a predetermined set of wavelengths to at least a predetermined degree. The method further comprises applying an acoustic field within the fluid and allowing the acoustic field to cause the quantum dots to accumulate at locations proximate to the excitation sites. The acoustic field may be a substantially stationary acoustic field. The method further comprises monitoring a distribution of the quantum dots within the fluid. The method further comprises initiating a phase transition of the fluid, based at least in part on the monitored distribution of the quantum dots, thereby trapping the quantum dots at the locations proximate to the excitation sites.

Throughout the specification, an acoustic field may be an ultrasonic field or an acoustic field comprising ultrasonic frequency components. Ultrasonic frequencies may be particularly applicable for driving quantum dots within the fluid. Other acoustic frequencies may be applied to facilitate this process and/or to provide other effects.

In some embodiments, one or more acoustic frequencies may be applied to the fluid, for example in frequency ranges such as vibrational ranges, infrasonic ranges, sonic ranges, and ultrasonic ranges. A combination of acoustic frequencies may also be applied with overlapping and/or interacting effects. In some embodiments, acoustic frequencies may be applied to controllably vary depth of the fluid and/or contour of the fluid surface, and hence thickness of the final quantum dot containing medium. Different thickness profiles of the medium may result in different optical properties. In some embodiments, acoustic frequencies may be applied to controllably vary quantum dot density in the fluid. In some embodiments, quantum dot densities may be controllably varied in up to three dimensions.

In some embodiments, an excitation source is an LED, light-emitting semiconductor junction, or other suitable light source configured to emit light at least in part for excitation of quantum dots. In some embodiments, an excitation source is an electrode or other suitable energy source configured for excitation of quantum dots. Excitation sources may be provided on a substrate comprising one or more semiconductor layers.

In embodiments of the present technology, monitoring the distribution of the quantum dots comprises: illuminating at least a portion of the fluid, thereby causing a fluorescence of quantum dots within said portion; and detecting the fluorescence using one or more optical detectors. A detected spatial pattern of the fluorescence may thereby be used as an indicator of the distribution of quantum dots.

Another aspect of the present technology provides a light emitting device manufactured by the foregoing method, or other methods as described herein. For example, such a light emitting device may comprise one or more excitation sources and a conversion layer adjacent to the excitation sources. The conversion layer may comprise a plurality of fluorescent quantum dots suspended in a light-transmissive material. A variety of quantum dots may be present, to provide fluorescence at a corresponding variety of wavelengths of light. The density of quantum dots may be variable within the conversion layer, such that the density is greater adjacent the excitation sources and lower away from the excitation sources.

In some embodiments, a light emitting device is provided wherein the fluorescent wavelengths of at least the quantum dots adjacent each of the excitation sources form a substantially continuous spectrum. The substantially continuous spectrum may occupy substantially the entire visible spectrum.

Embodiments of the technology relate to a device emitting one or more desired colours of light by using controlled deposition of quantum dots in solution, as described herein, along with a substrate comprising optical strips for channelling energy from excitation sources such as light-emitting diodes to the quantum dot containing material.

In some embodiments, a light emitting device is provided comprising a substrate carrying a plurality of independently controllable excitation sources. The plurality of independently controllable excitation sources may be evenly spaced apart along the substrate, or placed in a predetermined pattern corresponding to convenient locations to which the quantum dots are to be acoustically driven during manufacture, for example via an acoustic field comprising one or more ultrasonic components. In some embodiments, the plurality of independently controllable excitation sources comprises linear excitation sources extending parallel to one another.

Figure 1:
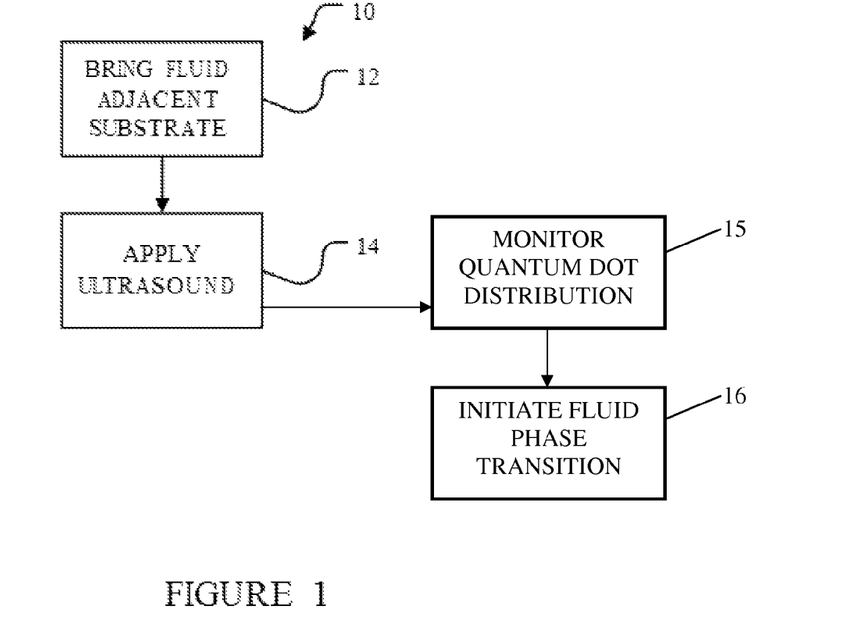
FIG. 1 is a flowchart illustrating a method for making a solid-state light emitting device, in accordance with embodiments of the present technology.

FIG. 1 is a flow diagram illustrating a method 10 for producing light emitters according to an example embodiment. In block 12, a fluid is placed adjacent to a substrate which contains one or more excitation sites. Quantum dots are either present initially in the fluid or are introduced to the fluid subsequently.

In block 14, the fluid containing the quantum dots is subjected to an acoustic field, for example an acoustic field consisting of or comprising ultrasonic components. The acoustic field is configured for application of force on the quantum dots of the fluid, thereby tending to direct the quantum dots toward a desired spatial distribution. The acoustic field may induce nodes and/or anti-nodes within the fluid at locations which correspond to the one or more excitation sites. Quantum dots within the fluid may tend to accumulate at the nodes or anti-nodes of the acoustic field, that is, at areas of local maximum or local minimum acoustic pressure. Therefore, the quantum dots accumulate at positions within the fluid adjacent to corresponding excitation sources. Whether quantum dots accumulate at the nodes or the anti-nodes depends in part on the relative properties of the quantum dots and the fluid. In particular, if the acoustic contrast factor of the quantum dots is positive, they will typically migrate to pressure nodes or minima, whereas if the acoustic contrast factor of the quantum dots is negative, they will typically migrate to pressure antinodes or maxima.

In some embodiments, the quantum dots of different sizes and photon conversion capability may be agitated into different spatial distributions within the fluid such that the mixture exhibits inhomogeneities. These inhomogeneities may be exploited such that their distributions can provide for alignment of quantum dots across a plane that can be mapped to a preferred distribution across an LED wafer or across the face of an LED array or at the discrete LED die level.

In block 15, the fluid is monitored to measure a distribution of quantum dots within the fluid. The total concentration of quantum dots may be measured as a function of location in the fluid. The concentration of quantum dots of a predetermined size range and/or of a predetermined range of optical properties may be measured as a function of location. The concentration of quantum dots may be measured as both a function of location and as a function of size and/or optical properties. Monitoring of the fluid, for example by causing the quantum dots to fluoresce and optically measuring their position, provides a means for feedback control of the manufacturing method. For example, phase transition control of the fluid, and possibly acoustic field control, may be based in part on measurements of the quantum dot distribution.

In block 16, the fluid is caused to undergo a phase transition, for example corresponding to setting or curing of the fluid, thereby trapping the quantum dots at the locations to which they were guided by the acoustic field. In some embodiments, the acoustic field may be maintained until the fluid has set sufficiently that the quantum dots remain in the selected locations adjacent to the corresponding excitation sources after the fluid has set completely. In some embodiments, the acoustic field may be adjusted as the fluid viscosity changes and the fluid sets. For example, the acoustic field may be provided to a strength that is required to maintain the quantum dots in desired locations or regions while allowing the fluid to set properly. Optical feedback may be used during this transitional period to control the acoustic field and/or the fluid phase transition. In some embodiments, the acoustic field may be removed at a predetermined time about the time of phase transition. Control of the acoustic field near phase transition may be performed based on a variety of considerations, such as quantum dot mobility in the fluid as viscosity increases, acoustic contrast factor, and the like.

In some embodiments, block 12 involves flowing the fluid across the substrate and block 14 involves applying the acoustic field while the fluid is flowing such that fresh quantum dots are brought to the nodes of the acoustic field and trapped there while the fluid is flowing. For example, quantum dot-containing fluid may be introduced at an inlet to a resonant chamber to which the acoustic field is applied, and quantum dot-depleted fluid may be removed at an outlet to the resonant chamber. Flow of the fluid through the chamber may be sufficient to introduce fresh quantum dots, while disturbing the quantum dots already captured by the standing wave pattern to an acceptably low degree.

In some embodiments, quantum dots may be introduced into the fluid at a predetermined or controllable rate, at predetermined or controllable times, and/or at predetermined or controllable locations. In some embodiments, the size ranges of quantum dots so introduced may also be predetermined or controllable, and may differ at different times and/or introduction locations. Quantum dots may be introduced by injection of quantum dots in a concentrated form or medium, and/or by flowing fresh fluid into the fluid region adjacent to the substrate. By controllably introducing quantum dots, the concentration of quantum dots may further be controlled in order to achieve a desired final distribution. By controlling the size of introduced quantum dots, the concentrations of quantum dots in different size ranges and in different locations may further be controlled in order to achieve a desired final distribution.

Figure 1A:
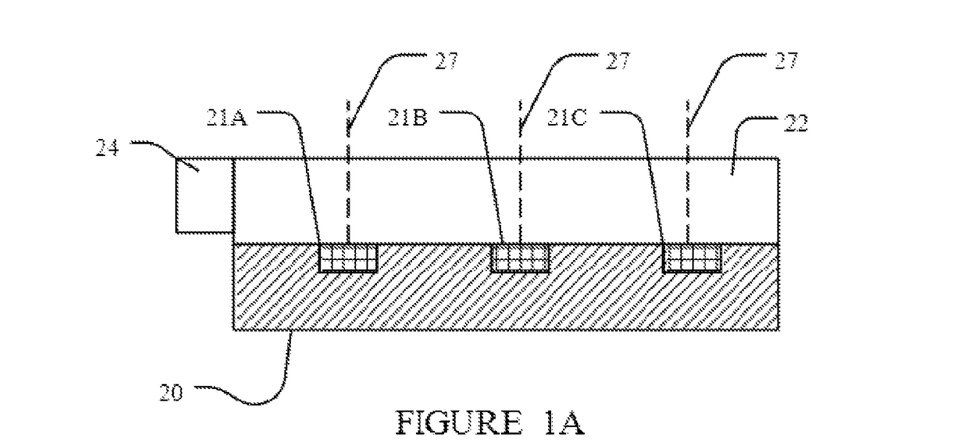
FIGS. 1A through 1C illustrate steps in the manufacture of a solid-state light emitting device, in accordance with embodiments of the present technology.

FIG. 1A illustrates schematically various steps in an embodiment of method 10. FIG. 1A shows a substrate 20 having excitation sources 21A, 21B, 21C spaced apart along its length. A layer of fluid 22 is caused to flow across substrate 20. An acoustic transducer 24, for example an ultrasonic transducer, applies an acoustic field within the flowing fluid. The acoustic waves are reflected at a reflector 25 to yield a stationary field in fluid 22. The wavelength of the acoustic field is selected such that nodes in the acoustic field are located at locations 27 which are within the fluid adjacent to excitation sources 21. In some embodiments, the acoustic field comprises a standing wave within the fluid 22.

Embodiments of the present technology comprise creating a standing or moving wave pattern in a fluid using one or more acoustic transducers operatively coupled to the fluid, as would be readily understood by a worker skilled in the art. For example, a variety of discrete standing wave patterns in a predetermined volume of fluid in a resonant cavity may be created by acoustically driving the fluid at one or more locations and frequencies, using acoustic transducers. The locations and frequencies may be pre-calculated, determined experimentally, or a combination thereof. In the case of a standing wave pattern, the quantum dots may tend toward a steady-state distribution which is influenced by the standing wave pattern, by a pre-calculated and/or experimentally determined relationship.

In some embodiments, the rate at which quantum dots approach a steady-state distribution may be dependent on quantum dot size. Therefore, the length of time that the acoustic field is applied for before the fluid phase transition is initiated may be adjusted so as to influence the final quantum dot distribution. Monitoring of the quantum dot distribution may be used to facilitate determining when to initiate such a phase transition. For example, the phase transition may be initiated when the distance between the current quantum dot distribution and a target distribution falls below a certain threshold. Various distance metrics between two particle distributions may be used, as would be readily understood by a worker skilled in the art, such as Hausdorff distance.

In some embodiments, a sequence of one or more standing wave patterns may be induced in the fluid, each pattern being induced for a controllable period of time. For example, a first standing wave pattern may be induced to obtain a first distribution of quantum dots, and then a second standing wave pattern may be induced to cause the quantum dots to flow from the first distribution toward a second distribution. A phase transition may be initiated at time when the quantum dots are in an intermediate distribution, between the first and second distributions. This approach may be used to facilitate increased control over the quantum dot distribution. In addition, the fluid may be controllably flowed across the substrate while standing wave patterns are generated, and/or quantum dots of one or more sizes may be added to the fluid at one or more locations and/or time intervals. Fluid flow rates and patterns, quantum dot injection rates and patterns, acoustic field (or standing wave) patterns and amplitudes, and/or phase transition initiation timing and other aspects may be controllably co-applied, and directed at least in part by optical feedback, so as to generate a desired final quantum dot distribution.

In some embodiments, acoustic excitation of the fluid medium may be configured to effect a desired distribution of quantum dots in a direction substantially perpendicular to the substrate surface, in addition to or instead of effecting a desired distribution of quantum dots in a direction substantially parallel to the substrate surface. For example, using adequate placement of acoustic transducers, standing wave patterns may be induced in directions which induce quantum dots to concentrate near the surface of the fluid or near the fluid-substrate interface.

Figure 1B:
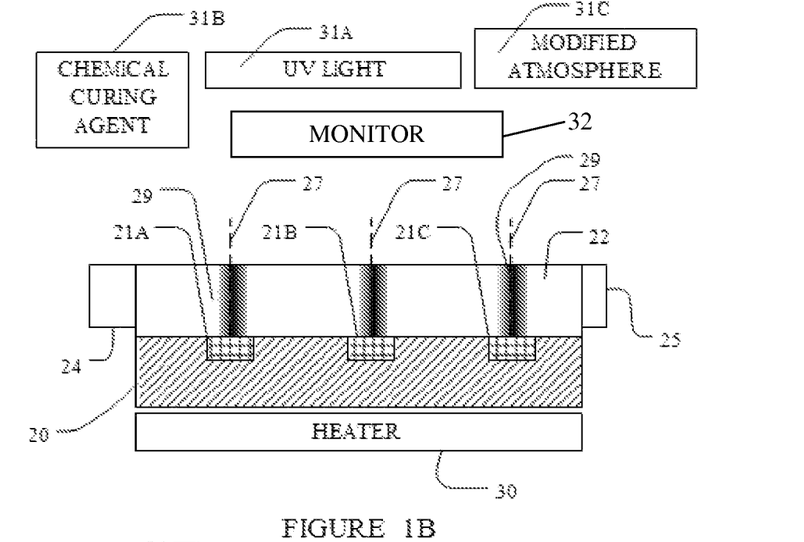

As illustrated in FIG. 1B, quantum dots 29 tend to accumulate at node locations 27. When sufficient quantum dots have been accumulated, as detected by optical monitoring 32, a phase transition (e.g. curing) of the fluid may be initiated by one of a number of known methods such as heat, light, catalysis or other methods. In the example embodiment, curing is initiated and/or accelerated by heating the fluid using a heater 30. Alternative modes for curing the fluid may involve application of UV light using a UV light source 31A, the addition of a catalyst or other chemical 31B that causes fluid 22 to cure, exposing the fluid to an atmosphere 31C that causes it to cure, or the like.

Figure 1C:
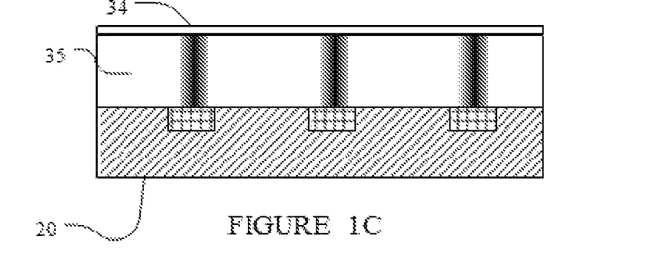
Figure 1D:
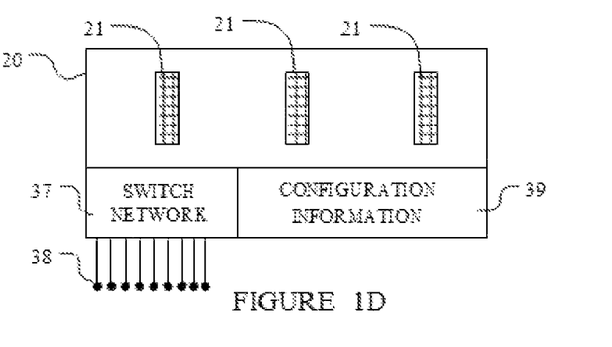
FIG. 1D is a schematic drawing illustrating a structure of a light emitting device, in accordance with embodiments of the present technology.

After the fluid has cured sufficiently, a transparent protective layer, such as a polycarbonate, glass, or diamond film, may optionally be deposited on top of the cured fluid 22 for handling and usage purposes. FIG. 1C illustrates an example embodiment in which a transparent protective layer 34 overlies a layer 35 of cured fluid. The completed device 23 may be packaged in a suitable way. In some embodiments, as illustrated schematically in FIG. 1D, packaging for the device includes within the packaging a switching network 37 which selectively connects one or more of excitation sources 21 to leads or other connectors 38 and/or a register, memory, or other store of electrically-readable configuration information 39 which can contain calibration information (as described below, for example).

In some embodiments, the fluid may comprise monomers that may be bound together to form a polymer, thereby transitioning the fluid to a solid phase. Suitable polymers may include polystyrene, epoxy, and the like. The monomer reaction may be initiated chemically, thermally, or by other means as would be readily understood by a worker skilled in the art. In some embodiments, optical properties of the fluid may change during and/or due to the phase transition. These changes may be anticipated and accounted for in the manufacturing process. It is desirable that the fluid has at least a predetermined degree of transparance or translucence in its fluid state as well as after it has undergone phase transition. Molecular characteristics of the monomers may be substantially different from molecular characteristics of the quantum dots, in order to facilitate concentrating the quantum dots by acoustic means while maintaining an adequately even distribution of monomers in the fluid.

In some embodiments, quantum dots used in the manufacture of a device as described herein comprise a range of differing fluorescent wavelengths. The wavelengths of light that a quantum dot emits when excited to fluoresce, are closely related to the size and configuration of the individual quantum dot. Quantum dots typically comprise very small crystals of semiconductor material. Generally, the smaller the size of the crystals, the larger is the bandgap within the crystal and the shorter is the wavelength emitted when the quantum dot fluoresces. Conversely, larger quantum dots tend to emit redder (lower energy) fluorescence.

In some embodiments, it is desired that the quantum dots include a variety of different sizes such that a spectrum of the fluorescence emitted by the quantum dots, when they are excited by one or more of the excitation sources, is substantially continuous. The visible spectrum extends from approximately 390 to 750 nanometers. In some embodiments, the quantum dots include quantum dots which emit light, when excited to fluoresce, at wavelengths which span some or all of the visible spectrum. In some embodiments, the quantum dots include quantum dots that have a first fluorescent wavelength and other quantum dots that have a second fluorescent wavelength where the two dominant wavelengths are separated by at least 200 nanometers. In some embodiments, the quantum dots include quantum dots that fluoresce in each of the red, green, and blue regions of the visible spectrum. In some embodiments, the concentration of quantum dots is such that, when excited by one of the excitation sources, the quantum dots associated with the excitation source emit light that is substantially white in appearance.

One method by way of which batches of quantum dots which fluoresce at a range of different wavelengths can be prepared is to grow quantum dots from a monomer which is allowed to become depleted during the process of growing the quantum dots. The size ranges of quantum dots formed in some chemical methods such as colloidal synthesis is dependent upon the concentrations of chemical species present as the quantum dots form. For example the size distribution of quantum dots formed by colloidal synthesis is sensitive to monomer concentration. When the monomer concentration is varied during growth, a variety of different sizes of quantum dots will be formed. This can be achieved, for example, by allowing the monomer to become depleted as a batch of quantum dots are grown.

Colloidal synthesis may be performed by mixing suitable precursor material(s) with, organic surfactants, and solvents. Upon heating to a sufficiently high temperature, the precursor(s) cause the solution to become supersaturated with the material of the quantum dots. Nucleation triggers the growth of nanocrystals which become quantum dots. The quantum dots may be of a suitable material such as cadmium selenide, cadmium sulfide, indium arsenide, indium phosphide, or the like. In some embodiments, the quantum dots may comprise quantum dots of multiple different materials which have different fluorescent characteristics.

The precursor material (and/or a transformed form of the precursor material) may be allowed to become depleted, for example, by performing the colloidal synthesis of the quantum dots in a batch process, so as to allow the growth conditions for quantum dots to change during the course of the synthesis. This can lead to a diverse range of different sizes of quantum dots being produced.

Other methods for synthesizing quantum dots may also be employed. Some examples of methods for synthesizing quantum dots include self assembly, epitaxial growth, electron beam lithography, viral assembly, electrochemical assembly, high temperature dual injection, and the like. These methods may be used to produce quantum dots which have a broad distribution of different fluorescent wavelengths.

In the alternative, if a chosen method for making quantum dots tends to produce mono-disperse particles, then multiple different sizes of quantum dots may be produced and mixed together to produce a set of quantum dots which fluoresce at a desired set of wavelengths. In general, producing mono-disperse quantum dots and then mixing them tend to be less cost effective than producing quantum dots by a method which tends to produce quantum dots having a random or quasi-random distribution of different sizes at first instance.

Figure 2:
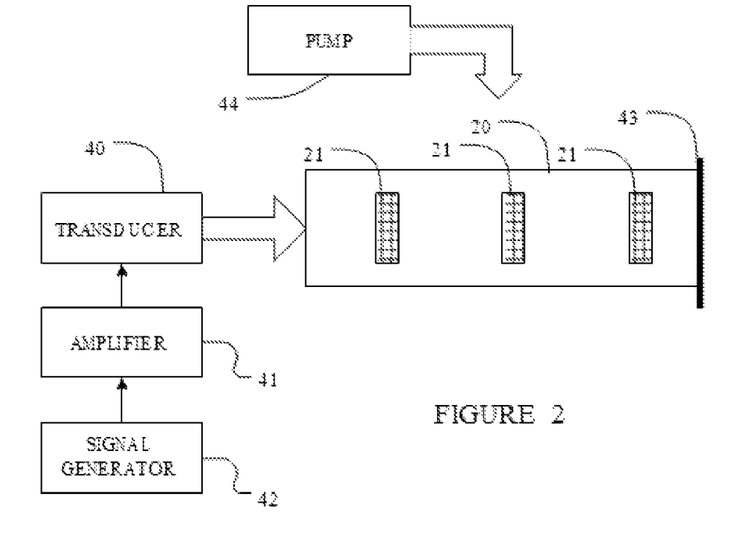
FIG. 2 is a schematic diagram illustrating apparatus for manufacturing light emitting semiconductor devices according to an example embodiment, in accordance with embodiments of the present technology.

FIG. 2 illustrates the use of acoustic radiation forces to drive quantum dots to the nodes (and/or anti-nodes) of a stationary acoustic field. FIG. 2 shows a substrate 20 carrying excitation sources 21, a layer of fluid 22 on substrate 20. An acoustic field is generated in the fluid 22 by an acoustic transducer 40, such as an ultrasonic transducer, driven by an amplifier 41 and a signal generator 42. A reflector 43 causes the ultrasound emitted by transducer 40 to cause standing waves in fluid 22.

In an example embodiment, a lead zirconate-titanate piezo-electric module is used as a transducer for creating an ultrasound field. For example, the transducers may be excited with a frequency in the range of 0.1 megahertz to 2.5 megahertz. For example, in some embodiments, the power may be 10 watts. Suitable alternative ultrasound transducers, such as barium titanate transducers, quartz transducers, or the like, may be used to create an ultrasonic field.

In some embodiments, a series of linear piezoelectric nodules may be provided which have a substantially similar shape as the excitation sources. The linear piezoelectric nodules may be used to generate acoustic forces above the linear power contacts.

In some embodiments, fluid 22 is flowing during the application of the acoustic field. For example, in an example embodiment a flow rate across substrate 20 is 5 milliliters per minute.

In embodiments of the present technology, under appropriate conditions, acoustic radiation forces can act to drive appropriate particle sizes to the nodes or antinodes of a stationary acoustic field and trap them there with a strength which can exceed the hydrodynamic drag exerted on the particles by a flowing fluid force.

In the illustrated embodiment a pump 44 causes fluid 22 to flow across substrate 20. In alternative embodiments, fluid 22 flows under the influence of gravity or centrifugal forces. In some embodiments the fluid flow occurs in a direction that is transverse to or at an angle to the direction of propagation of acoustic waves from transducer 24.

In accordance with aspects of the present technology, the process comprises monitoring a distribution of the quantum dots within the fluid. In some embodiments, monitoring the distribution of quantum dots comprises illuminating at least a portion of the fluid, for example corresponding to locations at which quantum dots are expected to collect (i.e. locations at the nodes and/or anti-nodes of the ultrasound field) with light at a wavelength suitable to make the expected quantum dots fluoresce. The fluorescent light may be detected using one or more optical detectors. Suitable optical detectors may include line sensors, optical photodiodes or camera systems.

In some embodiments, monitoring the distribution of quantum dots comprises monitoring the distribution of quantum dots of one or more predetermined size ranges. Quantum dots in different size ranges may be differentiated by colour, for example. Signals from an optical detector capable of adequate colour detection may be filtered, for example using a digital bandpass filter, to provide signals indicative of the distribution of quantum dots in a predetermined size range. In some embodiments, measuring the position of quantum dots of different sizes may comprise pulsing light of different wavelengths, pulse durations, intensities, or the like, or a combination thereof, from the illumination source, each pulse configured to cause a predetermined reaction in different sized quantum dots, and optically monitoring the response of the quantum dots to the different light pulses.

In some embodiments, ambient light levels, for example due to the illumination device for exciting the quantum dots and/or other ambient light, may be pre-measured and subtracted from the optical detector signals to provide an improved measurement of quantum dot distribution which is less corrupted by other illumination information.

In some embodiments, monitoring the distribution of quantum dots comprises monitoring indicators quantum dot concentrations in one or more locations, and optionally measuring, estimating and/or predicting corresponding quantum dot concentrations at these and/or other locations.

In some embodiments, flow of the quantum dot fluid 22 may be discontinued when the amount and distribution of detected fluorescent light indicates that a suitable number of quantum dots have been accumulated in a desired manner.

Excitation sources 21 may be of a suitable type capable of exciting quantum dots to fluoresce. In some embodiments, excitation sources 21 comprise electrical contacts which can be connected to a source of direct or alternating current sufficient to electrically excite the quantum dots. The electrical contacts may, for example, comprise electrically conducting materials such as metals or doped semiconductors. In other embodiments the excitation sources comprise sources of light that can "pump" the quantum dots to re-radiate light. The light sources may, for example, comprise semiconductor junctions, such as the light emitting junctions of light emitting diodes or laser diodes. The junction may be formed from suitable materials such as YAG, GaAn, InGaAn, AlGaN, AlGaInN, GaSb, GaAs, InP, organic or polymer light emitters, silicon-germanium alloys, or the like. Excitation sources 21 may comprise point sources or linear sources. In some embodiments, the acoustic field is such that quantum dots tend to collect along planes which are perpendicular to the plane of substrate 20 and the excitation sources comprise linear excitation sources aligned along an edge of a plane containing quantum dots.

In some embodiments, the excitation sites may be selected at least in part to correspond to a predetermined distribution of the quantum dots, which in turn corresponds to a predetermined application of acoustic energy. For example, some distribution patterns of quantum dots may be relatively easy to obtain by inducing a relatively simple standing wave pattern in the fluid. Therefore, rather than starting with a pattern of excitation sites and attempting to discover how to drive the quantum dots toward these sites, an accessible quantum dot distribution may first be determined, and the excitation sites selected based on this distribution.

Where a device as described herein comprises multiple excitation sources which are each located to excite quantum dots in one or more regions, then the light emitted as a result of operating different ones of the excitation sources may have different spectral characteristics (since the distributions of quantum dots adjacent to different excitation sources 21 may be heterogeneous). In some embodiments, a device as described herein may be caused to emit light having a desired and readily modifiable spectral characteristic by operating different ones of the excitation sources in a suitable combination.

Figure 3:
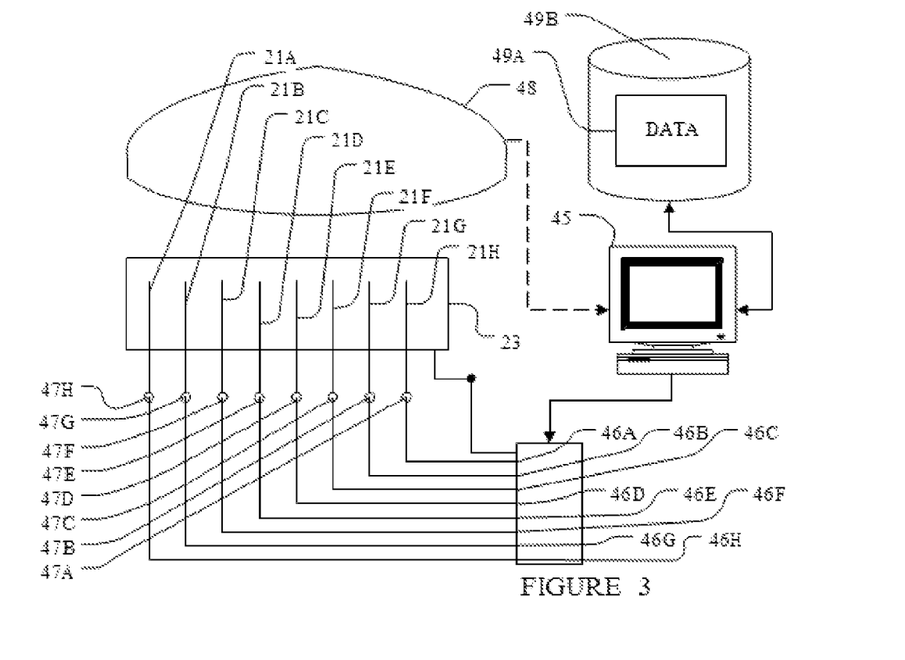
FIG. 3 illustrates a calibration apparatus, in accordance with embodiments of the present technology.
Figure 4:
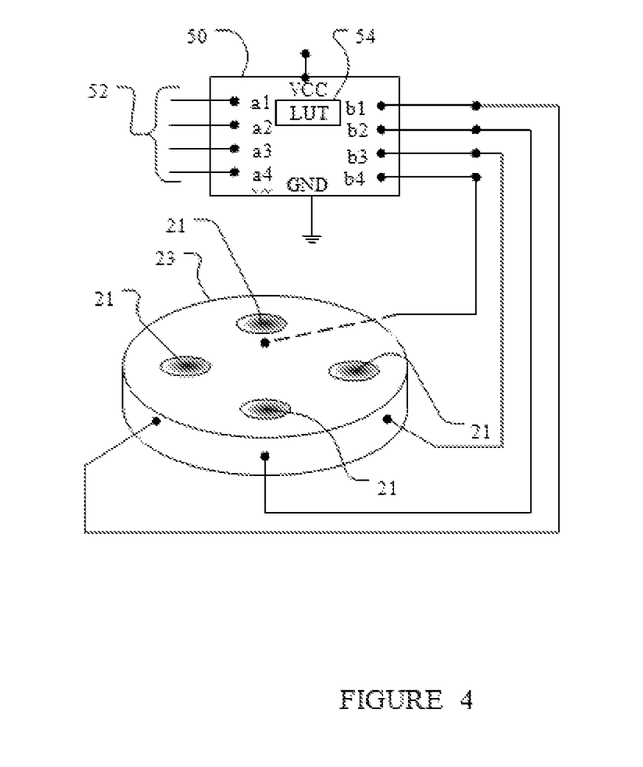
FIG. 4 illustrates an application of a light emitting device, in accordance with embodiments of the present technology.

FIG. 3 illustrates a calibration apparatus comprising a controller 45 which is configured to independently apply an electrical excitation signal to each of the excitation sources 21 in a device 23. In some embodiments, the current and voltage supplied to the excitation source may be individually controlled. In some embodiments, controller 45 is capable of selectively applying alternating current (AC) or direct current (DC) to the corresponding excitation source. In such embodiments, the frequency of AC current and/or waveform may also be controllable by the controller 45.

In the illustrated embodiment, controller 45 has eight separate outputs 46A to 46H which are each connected to a corresponding input 47A to 47H for driving a corresponding one of excitation sources 21A to 21H.

A spectral photometer measuring system 48 detects amplitude and wavelengths of light emitted by device 23. Controller 45 comprises a sequencer or programmable controller or the like configured to activate each one of excitation sources 21A to 21H in turn by applying a suitable electrical signal to it. While this is occurring, the spectral photometer measuring system 48 is caused to detect the spectrum emitted by the device 23. Controller 45 can then determine information specifying a combination of the excitation sources 21 to be operated to generate light having a desired spectrum.

In some embodiments, the information comprises information characterizing specific driving conditions for one or more different ones of the excitation sources. The information may comprise, for example: a set of excitation sources to be operated to deliver light of a desired spectral composition; operating conditions for each of the excitation sources to cause the device to emit light of a desired spectral composition (the operating conditions may include operating conditions under which the excitation source is not used); or the like.

In the illustrated embodiment, information 49A is stored in a suitable data repository 49B such as a memory, set of registers, lookup table, set of switch configurations, or the like. In some embodiments, the information 49A comprises a lookup table or set of equations which characterizes the light emitted when each of excitation sources 21 is operated. In such embodiments, the information may be used subsequently to determine which excitation sources ought to be used to generate a desired light output.

Information 49A may be stored in a memory or other data store associated with device 23, a memory or data store associated with a power control circuit to be used to operate device 23 or the like.

In another embodiment, a switch network 37 (see FIG. 1D) on a device 23 being calibrated is set to deliver a driving signal to those excitation sources 21 which collectively yield the desired spectrum (and not to other excitation sources 21 that may also be present on the device 23).

Figure 5:
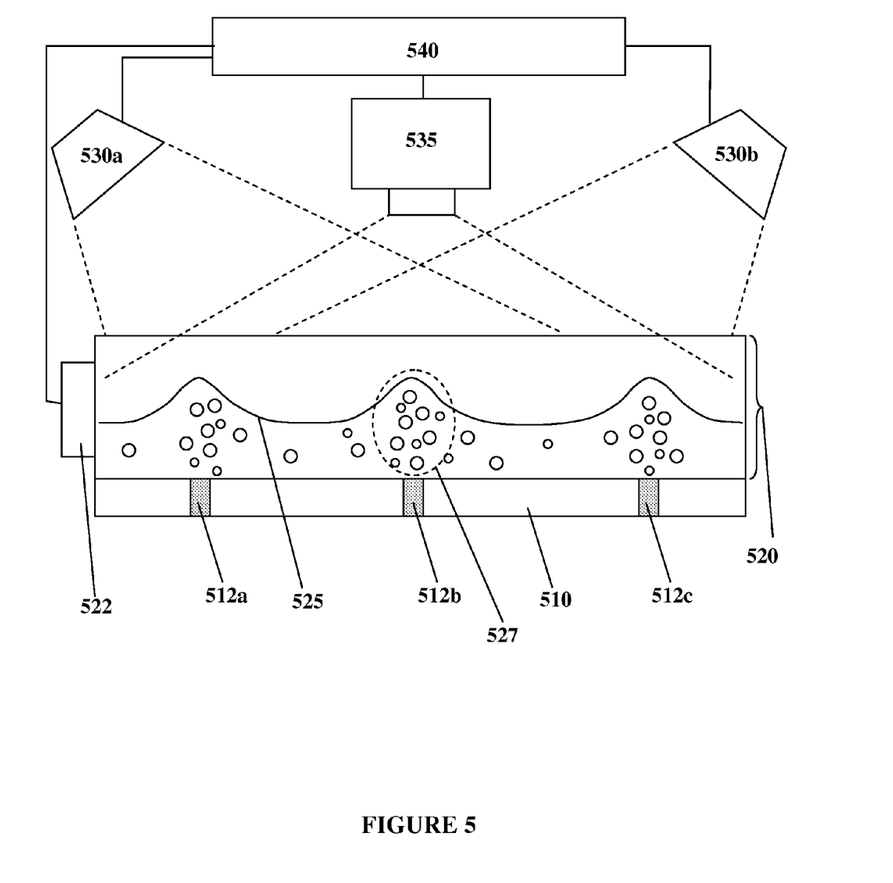
FIG. 5 illustrates a manufacturing setup corresponding to a method for fabricating a light emitting device, in accordance with embodiments of the present technology.

FIG. 5 shows an example of a device 23 being applied to emit light. A power control circuit 50 receives commands by way of a suitable control input 52. The control input 52 may, for example, comprise an analog or digital input signal. In some embodiments, the control input 52 receives commands using a protocol, such as a DMX protocol.

Power control circuit 50 looks up in a lookup table 54 which excitation sources 21 ought to be energized to produce light according to a control input received at input 52. Power control circuit 50 may additionally determine driving conditions for the excitation sources (for example, current, voltage, frequency, waveform). Power control circuit 50 may then apply the determined driving signals to outputs connected to drive the excitation sources 21. In the illustrated embodiments, digital to analog converters generate the output power signals.

In some embodiments, power control circuit 50 comprises a microprocessor executing firmware instructions that cause the microprocessor to read one or more digital or analog inputs to detect control signal 52, determine appropriate driving values for excitation sources 21 based on the control signal and information 49A, and generate and apply driving signals to device 23. The driving signals cause the energized excitation sources 21 to excite the corresponding quantum dots to re-radiate all or a portion of the incident light at suitable wavelengths. The light emitted by device 23 illuminates the surrounding area and may be applied in a suitable manner from architectural lighting to lighting in some other context.

Embodiments of the present technology relate to the creation of a spatial distribution of optically active quantum dots within a liquid via acoustic means. For example, by using acoustic transducers to create a standing wave pattern in a fluid containing quantum dots, the quantum dots may be induced to move toward a pattern which is determined at least in part by the induced standing wave pattern. For example, quantum dots may be induced to concentrate near nodes or anti-nodes of the standing wave pattern, depending on their acoustic contrast factor in the fluid. Moreover, quantum dots of different sizes may react in different ways and/or move at different rates in response to the standing wave pattern, thereby providing a means for controlling the size distribution of quantum dots at one or more locations in the fluid. For example, quantum dots may move differentially by size within a given level of viscosity and energy distribution within the fluid.

Embodiments of the present technology relate to "casting" the quantum dots in place within a carrier, by initiating a phase transition of the fluid carrier at an appropriate time, for example while the quantum dots are in or are approaching a predetermined acoustically created distribution.

Embodiments of the present technology relate to monitoring of the distribution of quantum dots in the fluid, for example by causing the quantum dots to fluoresce and optically monitoring the fluid to measure total concentration of quantum dots in one or more locations and/or concentrations of quantum dots in one or more predetermined size ranges in one or more locations. The measured concentrations may then be used as feedback for process control and/or quality control.

Some existing methods of quantum dot growth, such as lower cost methods, create substantially varying sizes of quantum dots. Direct use of such a source of quantum dots may lead to a poly-distribution of quantum dots within the fluid carrier. However, in some cases it may be desirable to modify the distribution of the quantum dots within the fluid. In some embodiments, acoustic methods as described herein may be used to filter the quantum dots prior to casting them in place. Thus, for example, the quantum dots may be sorted and ordered for the purpose of creating a varying distribution that may be used to tune the output of an LED. This process may be more cost effective than creating custom distributions of varying sizes of quantum dots by mixing of mono-distributed quantum dots manufactured by other means.

Embodiments of the present technology incorporate the use of a photo-feedback means during manufacturing with an acoustic process for physically driving the quantum dots. The acoustic process may then be controlled based at least in part on feedback obtained via light emission from the quantum dots in solution. Such a feedback control scheme may be configured to create different desired types of quantum dot distributions and/or to provide feedback as to the ordering of the quantum dot densities and distributions within the fluid.

Suitable optical feedback devices may comprise array-based cameras and suitable light pump devices to cause the quantum dots to re-radiate that are optically coupled to the fluid holding the quantum dots and the acoustic radiators and reflecting surfaces. As quantum dots are organized within the fluid by the acoustic fields, the camera system and a processor may be used to determine timing with which to initiate a phase transition of the fluid, for example by introducing a catalyst to "cure" the quantum dots in place within the fluid.

In some embodiments, acoustic standing waves and/or quantum dot distributions may be monitored via a crossed beam optical system. The optical system may be configured to illuminate the fluid using one or more light beams, for example originating from lasers or focused light sources, thereby exciting quantum dots in the fluid. The light beam source may be a pump source causing the quantum dots fluoresce. A plurality of optical detectors such as camera systems may be used to view the differential response of quantum dots by region as the beam or beams are driven across the fluid. Thus, in some embodiments, the effects of one beam may be measured by plural optical detectors. The light beams may be controllably tracked across the fluid, for example applying the light beams to different fluid regions at different times in a raster pattern or other scanning pattern. The light beam sources may be configured such that their light beams are incident to the fluid surface at an angle perpendicular to the fluid surface or at a non-perpendicular angle. For example, a light source mounted on a two-dimensional translation stage may be used to direct a light beam at different portions of the fluid at a substantially constant, for example perpendicular, angle. A rotation stage may be used to controllably vary the angle of incident light. In some embodiments, one or more focused or unfocused optical detectors may be cooperatively used with each light beam source, for example co-mounted with the light beam source or controllably mounted at one or more other locations to receive a fluid-reflected portion of a light beam and/or light emitted by the quantum dots as induced by a light beam.

In embodiments of a cross beamed optical system, two or more light beams may be incident on a same portion of the fluid at substantially the same time or at closely spaced time intervals but at different angles, and one or more corresponding optical detectors may be configured to detect light beam reflections and/or quantum dot fluorescence due to said light beams at said fluid portion. By measuring the response of the quantum dots to incident light from beams applied in plural directions, and by comparing such responses over plural, typically adjacent, fluid regions, possibly along with other measurements or continuity assumptions, information regarding the quantum dot distribution in directions both parallel to the fluid surface and perpendicular to the fluid surface may be obtained.

In some embodiments, a cross beamed optical system may be configured for analysis of both the variance of the quantum dot distribution in a direction perpendicular to the fluid surface and the variance of the quantum dot distribution in a direction at an angle to the fluid surface, and variance of the quantum dot distribution in a direction parallel to the fluid surface may be resolved via scanning across the surface and looking at the combination of light emission from the fluid. Varying quantum dot densities may create differential scattering as a beam of light, as in a laser, is tracked across the material. The scattered light may be detected by plural optical sensors of the cross beamed optical system.

In some embodiments, the approach of acoustically driving the quantum dots, controlled at least in part based on optical feedback, may be used as a means to "drive" quantum dots of varying sizes in a fluid, for example quantum dots obtained from a lower-cost polydistributed manufacturing method. Different sizes of quantum dots may thereby be controllably moved to different regions of the fluid, for example different locations within a plane or linear pipeline. Once a desired distribution of quantum dots is obtained, different regions may be siphoned away in solution. This method may provide a means for sorting the quantum dots into batches of known predetermined size. Siphoning can then carry the quantum dots in solution to either a storage system, or a manufacturing process that utilizes them based on some pre-arranged parameters that are met by their unique distribution. In one example, quantum dots may be harvested in this manner for a particular colour temperature of light emission and as they are "pulled" from the production stream they are able to be sent to a casting process where they are utilized to manufacture precise color conversion plates or sheets that are used with individual, or groups of LEDs or Laser diodes.

In some embodiments, the present technology may be directed toward creating a varying distribution of quantum dot densities over an area surface or volume by steering the quantum dots, under optical feedback, within an acoustic field. The quantum dots may then be optionally locked in place at a certain time, determined based on optical feedback. In some embodiments, the process, including optical measurements, may be used to create the equivalent of a "wafer map" indicative of overall quantum dots densities and possibly of quantum dot densities corresponding to various predetermined size ranges of the quantum dots. In a further embodiment, the resulting wafer may cut or "diced" into discrete tiles or pieces of material with specific properties corresponding to the known quantum dot population characteristics, such as population densities, for each piece. These wafers may be subsequently matched to specific pump LEDs or Laser Diodes or other excitation sources so as to create quantum dot-enabled lighting devices with known properties.

FIG. 5 illustrates, in cross-section, a manufacturing setup for fabricating a light emitting device, in accordance with embodiments of the present technology. A substrate 510, such as a substantially circular silicon wafer, is provided, the substrate 510 comprising excitation sites 512a, 512b, and 512c. An excitation source may be provided at each of the excitation sites. A fluid container 520 is provided adjacent to the substrate, and a fluid containing quantum dots is added thereto. The fluid container 520 comprises at least two sidewalls and is configured to trap the fluid in the area adjacent to the substrate 510. An acoustic transducer 522, such as a piezoelectric transducer, is operatively coupled to a wall of the fluid container. Plural acoustic transducers (not shown) may also be provided and positioned as required for creating a desired acoustic field, such as a stationary acoustic field. The fluid container 520 may act as a resonant cavity, with acoustic waves reflecting off of walls thereof to induce a standing wave pattern. A standing wave pattern 525 may be induced in the fluid. The standing wave pattern 525 is schematically illustrated in FIG. 5, with peaks corresponding to pressure maxima and valleys corresponding to pressure minima. As further illustrated, the fluid and quantum dots are such that the quantum dots are induced, by the acoustic pressure, to concentrate near the pressure maxima, for example in region 527. The pressure maxima are further located proximate to the excitation sites 512a, 512b, and 512c. The quantum dots may initially be dispersed in a substantially homogeneous state throughout the fluid, and migrate to the pressure maxima over time once the acoustic field is induced.

As further illustrated in FIG. 5, at least a portion of the fluid is illuminated by light sources 530a and 530b. The light sources are configured to cause the quantum dots in the fluid to fluoresce. It is also contemplated that, if the excitation sites 512a, 512b, and 512c comprise operational excitation sources, these may be used instead of the light sources 530a and 530b to excite the quantum dots in the fluid. An optical detector 535, such as a colour camera, is configured to measure light emitted by the quantum dots in one or more regions of the fluid, possibly along with other light such as light from the light sources 530a and 530b which is reflected and/or transmitted by the fluid. Measuring light may comprise measuring intensity or light of one or more wavelengths. The manufacturing setup may be implemented in controlled lighting conditions to reduce optical noise.

The optical detector 535, and possibly the light sources 530a and 530b and acoustic transducer 522, are operatively coupled to a processor 540. The processor 540 is also coupled to a means for initiating a phase transition of the fluid (not shown), such as a heater, chiller, source of UV light, chemical curing agent injector, atmospheric injector, or the like. The processor 540 may comprise a microprocessor operatively coupled to memory and/or other computer components. The processor 540 may be configured to process signals from the optical detector 535 to provide one or more measurement values indicative of the distribution of quantum dots in the fluid. In some embodiments, the processor 540 may further be configured to determine a difference between a measured distribution of the quantum dots and a desired distribution.

The processor 540 may be configured to perform other operations, such as compensating for ambient light, adjusting the light sources 530a and 530b, predicting a future distribution of the quantum dots, noise filtering, and the like.

In some embodiments, the processor 540 may be configured to adjust operation of the acoustic transducer 522 based on the measured distribution of quantum dots, and/or to switch off the acoustic transducer 522 at an appropriate time, for example after initiating a phase transition of the fluid. The processor may be configured to control operation of the means for initiating the fluid phase transition at an appropriate time, for example when the measured quantum dot distribution is adequately close to the desired distribution.

Figure 6:
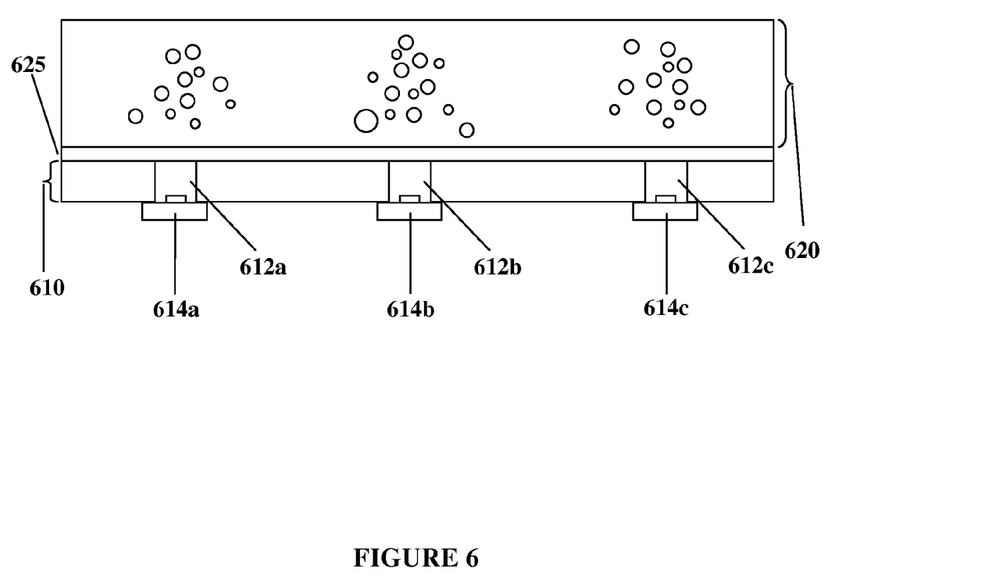
FIG. 6 illustrates a light emitting device fabricated by a method in accordance with embodiments of the present technology, as well as aspects of said method.

FIG. 6 illustrates, in cross section, a light emitting device fabricated by a method in accordance with embodiments of the present technology, and further illustrates aspects of such a method. The light emitting device comprises a substrate layer 610 having excitation sites corresponding to apertures 612a, 612b, 612c, at locations to which excitation sources 612a, 612b, 612c, such as LEDs are coupled. For example, LEDs may be undermounted to the apertures so that light emitted thereby enters the apertures. Alternately, the LEDs could be mounted on a further substrate at locations substantially in line with the apertures for subsequent interconnection between the substrate layer 610 and the substrate carrying the LEDs. In accordance with some embodiments of the illustrated method, the excitation sources 614a, 614b, 614c are coupled to the excitation sites 612a, 612b, 612c after the fluid has been transitioned to a solid phase. Thus, the substrate layer 610 may be free of the excitation sources during application of the quantum dot fluid and acoustic manipulation of same.

The substrate layer 610 may be provided with a transparent or translucent coating 625 prior to introduction of the fluid, which inhibits the fluid from flowing into the apertures 612a, 612b, 612c. The coating 625 may be formed from material such as polycarbonate, polystyrene, epoxy, or the like. Although the coating 625 is illustrated as being disposed across the top of the substrate layer 610, it may alternatively be disposed substantially only overtop of the apertures and not the remainder of the substrate, or inside top or bottom portions of the apertures. The coating 625 may be provided so that a substantially flat surface is provided which contacts the fluid during manufacture, for example by providing a flat overcoating or by providing coating material within the apertures, the coating material being flush with the substrate layer.

In some embodiments, the coating 625 may be configured to provide a surface of predetermined curvature. For example, the coating 625 may be curved to provide an optical interface region with predetermined optical properties. By varying the curvature of the coating or other optical layers, optical structures may be provided in the device having desired optical properties, for example to facilitate focusing of light, diffusing of light, or other optical effects.

FIG. 6 further illustrates a quantum dot containing region 620, which comprises a substantially solid medium with quantum dots concentrated near the excitation sites 612a, 612b, 612c. The quantum dot region 620 is produced according to a method as described herein, wherein a quantum dot containing fluid is manipulated by an acoustic field and then a phase transition is initiated therein to provide the substantially solid medium.

In embodiments of the present technology, the substrate may be configured as a flat sheet, a contoured sheet, or another structure such as tube, hemispherical shape, parabolic shape, or the like.

In some embodiments, a sheet of material containing quantum dots may be made prior to attaching to a substrate. In some embodiments, there is provided method for manufacturing a light emitting device, the method comprising: providing a fluid adjacent in a container, the fluid carrying quantum dots; applying an acoustic field, such as an ultrasonic field, within the fluid and allowing the acoustic field to cause the quantum dots to accumulate at one or more predetermined locations; monitoring a distribution of the quantum dots within the fluid; initiating a phase transition of the fluid based at least in part on the monitored distribution of the quantum dots, thereby providing a solid medium containing the quantum dots trapped at the one or more predetermined locations; providing a substrate having one or more excitation sites; and affixing the solid medium to the substrate, wherein the one or more excitation sites are proximate to the one or more predetermined locations. Thus, in some embodiments, the quantum dots are affixed into a solid medium first, and then subsequently attached to a substrate containing or receiving excitation sources. For example, in this manner, a sheet or surface of quantum dot containing material may be applied either directly onto a finished substrate (as in a wafer scale process) or a sheet of quantum dot containing material may be manufactured and applied in whole form or in segregated form on top a substrate or substrates each containing one or more light pump module excitation sources.

It is obvious that the foregoing embodiments of the technology are examples and can be varied in many ways. Such present or future variations are not to be regarded as a departure from the spirit and scope of the technology, and all such modifications as would be obvious to one skilled in the art are intended to be included within the scope of the following claims.

We claim:

1. A light emitting device comprising:
   a.) a substrate having one or more excitation sites;
   b.) one or more excitation sources operatively coupled to the one or more excitation sites, the one or more excitation sources at least in part configured for excitation of quantum dots; and
   c.) a conversion layer adjacent to the substrate, the conversion layer containing quantum dots suspended in a light-transmissive material;
   wherein the conversion layer is provided by:
      i.) providing a fluid in a container, the fluid carrying quantum dots;
      ii.) applying an acoustic field within the fluid;
      iii.) allowing the acoustic field to cause the quantum dots to accumulate at one or more predetermined locations corresponding to the excitation sites;
      iv.) monitoring a distribution of the quantum dots within the fluid; and
      v.) initiating a phase transition of the fluid based at least in part on the monitored distribution of the quantum dots, thereby trapping the quantum dots at the predetermined locations.

2. The light emitting device according to claim 1, wherein the substrate forms at least a portion of the container.

3. The light emitting device according to claim 1, wherein monitoring the distribution of the quantum dots comprises:
   a.) illuminating at least a portion of the fluid, thereby causing a fluorescence of quantum dots within said portion; and
   b.) detecting a spatial distribution of the fluorescence using one or more optical detectors.

4. The light emitting device according to claim 1, wherein the conversion layer comprises a first population of quantum dots having fluorescent wavelengths in a first band, and a second population of quantum dots having fluorescent wavelengths in a second band different from the first band.

5. The light emitting device according to claim 4, wherein the first population is distributed differently from the second population.

6. The light emitting device according to claim 1, wherein at least one excitation site is located adjacent to an anticipated accumulation location of the quantum dots.

7. The light emitting device according to claim 1, wherein the excitation source are selected from the group comprising: LEDs, light-emitting semiconductor junctions, and electrodes.

8. The light emitting device according to claim 1, wherein the excitation sources are independently controllable with respect to one or more of intensity of light and colour of light.

9. The light emitting device according to claim 1, wherein the conversion layer is a discrete portion of a larger conversion layer.

10. The light emitting device according to claim 1, wherein at least one of the substrate and the conversion layer have a contoured surface.

11. The light emitting device according to claim 1, wherein the distribution of the quantum dots is variable in two dimensions or three dimensions.

12. The light emitting device according to claim 1, wherein the distribution of the quantum dots is variable in at least a direction parallel to the substrate surface.

13. The light emitting device according to claim 1 wherein the distribution of the quantum dots is variable in at least a direction perpendicular to the substrate surface.

* * * * *